(12) United States Patent
Schleicher et al.

(10) Patent No.: US 7,281,227 B2
(45) Date of Patent: Oct. 9, 2007

(54) METHOD AND DEVICE FOR THE COMPUTER-AIDED DESIGN OF A SUPPLY NETWORK

(75) Inventors: Mario Schleicher, Strasslach-Dingharting (DE); Birgit Klein, Grafing (DE)

(73) Assignee: Infineon Technologies AG, Munich (DE)

( * ) Notice: Subject to any disclaimer, the term of this patent is extended or adjusted under 35 U.S.C. 154(b) by 230 days.

(21) Appl. No.: 10/954,643

(22) Filed: Sep. 30, 2004

(65) Prior Publication Data

US 2006/0075373 A1    Apr. 6, 2006

(51) Int. Cl.
  *G06F 17/50* (2006.01)
(52) U.S. Cl. .............. 716/10; 716/11; 716/14; 716/13
(58) Field of Classification Search ............ 716/10, 716/11, 14, 13
   See application file for complete search history.

(56) References Cited

U.S. PATENT DOCUMENTS

| | | | | |
|---|---|---|---|---|
| 4,942,317 A * | 7/1990 | Tanaka et al. | | 326/37 |
| 5,331,572 A * | 7/1994 | Takahashi | | 716/11 |
| 5,552,333 A * | 9/1996 | Cheung et al. | | 438/129 |
| 5,808,900 A * | 9/1998 | Buer et al. | | 716/10 |
| 6,086,627 A * | 7/2000 | Bass et al. | | 716/5 |
| 6,457,157 B1 * | 9/2002 | Singh et al. | | 716/2 |
| 6,487,682 B2 * | 11/2002 | Yamamura et al. | | 714/30 |
| 6,499,134 B1 * | 12/2002 | Buffet et al. | | 716/12 |
| 6,516,446 B2 * | 2/2003 | Anzai | | 716/1 |
| 6,591,410 B1 * | 7/2003 | Ali et al. | | 716/12 |
| 6,625,792 B1 * | 9/2003 | Yamasaki | | 716/11 |
| 6,675,367 B1 * | 1/2004 | Torii | | 716/14 |
| 6,735,755 B2 * | 5/2004 | Shau | | 716/16 |
| 6,823,501 B1 * | 11/2004 | Dahl | | 716/9 |
| 6,948,138 B1 * | 9/2005 | Shen | | 716/2 |
| 2001/0039642 A1 * | 11/2001 | Anzai | | 716/10 |
| 2002/0087940 A1 * | 7/2002 | Greidinger et al. | | 716/2 |
| 2003/0061571 A1 * | 3/2003 | Buffet et al. | | 716/1 |

\* cited by examiner

*Primary Examiner*—Phallaka Kik
(74) *Attorney, Agent, or Firm*—Brinks Hofer Gilson & Lione

(57) ABSTRACT

A supply network is designed for a microelectronic circuit by a method for computer-aided design, in that an outline of the microelectronic circuit is detected and the supply network is generated with this outline. In the process, the supply network is designed with a structure in which a pattern is pre-determined and is repeated within the outline of the supply network until the supply network is completely filled up. In addition, a device is disclosed that is configured to carry out the above method.

11 Claims, 3 Drawing Sheets

METHOD AND DEVICE FOR THE COMPUTER-AIDED DESIGN OF A SUPPLY NETWORK

BACKGROUND

The present invention relates to a method and a device for the automatic computer-aided design of a supply network for a microelectronic circuit.

In the case of a power supply of a microelectronic circuit, designed in the Full Custom Design, for example, with a very current-intensive data path circuit, it is necessary to use effective wiring that supplies the circuit with current or power in a very stable manner. Because of the very high frequencies with which data path circuits of this type are operated, power consumption is very high, especially in CMOS circuits. In order to keep the supply voltage of the circuit stable, the wiring is effected via a supply network of metal layers. This supply network is generated with a physical density, i.e. a metal density, which is dependent on the power consumption and on design rules. Use of the supply network generated, which is also called a power grid, with the circuit to be supplied, takes place by means of vias which are arranged precisely where supply lines of the circuit intersect with the supply network. In the process, a high density of the vias leads to an efficient power supply, as a resistance from a voltage source to the circuit and therefore also a drop in voltage from the voltage source to the circuit is thereby kept low.

According to the prior art, the supply network is generated manually in a very time-consuming process or method by a layouter. In this instance, if there is a change to the layout of the circuit, the supply network for this circuit has to be changed with high outlay or occasionally even has to be completely reproduced. According to the conventional method, the supply network is designed in that individual modules are created which are joined together manually in such a way that a complete network is produced covering the entire layout of the circuit. In this instance, deviations from a regular structure of the supply network have to be generated manually in separate cells and inserted at the corresponding position.

SUMMARY

Aspects of the invention simplify the design of the supply network.

By way of introduction only, a method is provided for the computer-aided design of a supply network for a microelectronic circuit. In the process, an outline of the microelectronic circuit is detected and a specific structure is pre-determined for the supply network. The supply network is then designed with the outline of the microelectronic circuit and designed with the specific structure.

This means that the supply network is designed with the outline or an area defined by the outline, which is congruent with the outline or area of the microelectronic circuit. If the microelectronic circuit, for example, has no circuit parts at a specific position, in other words has a type of hole there, the supply network designed also has a hole or no wiring at the corresponding position. It is pre-determined with the structure, at which positions current-carrying circuit-board conductors occur in the supply network and how these are guided.

As the previously implemented step of detecting the outline of the microelectronic circuit and generating the supply network with the detected outline and with the pre-determinable structure can be carried out automatically in a computer-aided manner, the design of the supply network is markedly simplified in an advantageous manner.

In particular, a pattern is pre-determined in the process, with which the specific structure of the supply network is designed, in that this pattern is repeated within the outline or area of the supply network, until the entire area of the supply network is filled up.

As the structure is generated by the repetition of the previously pre-determined pattern, generation of the structure is markedly simplified in an advantageous manner. Furthermore, the structure can easily be changed in that the basic pattern is easily changed.

In accordance with this aspect of the invention, a size and/or a shape or an outline of the pattern can be selected as a function of the outline of the supply network.

The pattern can therefore, for example, be adapted in such a way that a repetition of the pattern virtually optimally fills up the area of the supply network, without a remainder of the area of the supply network remaining, which can then only be filled with parts of the pattern.

In an aspect of the invention, an area can be pre-determined which is then excluded from the area of the supply network.

It is thus possible to provide no connection lines, in particular current-carrying connection lines, in the associated supply network, at positions, which are disturbed with respect to their function by power supply lines.

Furthermore, it is possible for access points of the microelectronic circuit to be predetermined and the supply network to be designed such that these access points are connected to the supply network during design.

It can thus, for example, be easily ensured that external access points, for example primary clock sources or supply voltages, can be connected to the supply network.

In particular virtual connectors, e.g. pins and labels for further processing by a higher-order computer-aided design method can be set up for the supply network. These virtual connectors contain information about a specific part of the supply network and are mainly used to create a connection between the supply network and other circuit parts.

In this instance, the pins are required by a Full Custom Design method and the labels by a Semi Custom Design method for further processing.

In accordance with an aspect of the invention, the supply network may be a supply voltage network for the power supply of the microelectronic circuit, a clock network, which supplies the microelectronic circuit with one or more clock signals, or a network, which supplies the microelectronic circuit with one or more control signals.

In another aspect of the present invention, a method for the computer-aided design of a microelectronic circuit is provided. This method operates with the previously described method for the design of a supply network for the microelectronic circuit.

In another aspect of the present invention, a device for the computer-aided design of a supply network is provided for a microelectronic circuit. In the process, the device is configured in such a way that it detects an outline or an area of the microelectronic circuit and designs the supply network with this outline or with this area. The device thus designs the supply network within the area of the supply network with a structure which can be pre-determined.

Furthermore, an aspect of the invention also comprises a data carrier or a computer program product with a computer program which implements the method previously described in the case of implementation in a computer system.

BRIEF DESCRIPTION OF THE DRAWINGS

The present invention will be described in more detail hereinafter with reference to the accompanying drawings with the aid of preferred embodiments. In the drawings.

DETAILED DESCRIPTION

Figure 1:
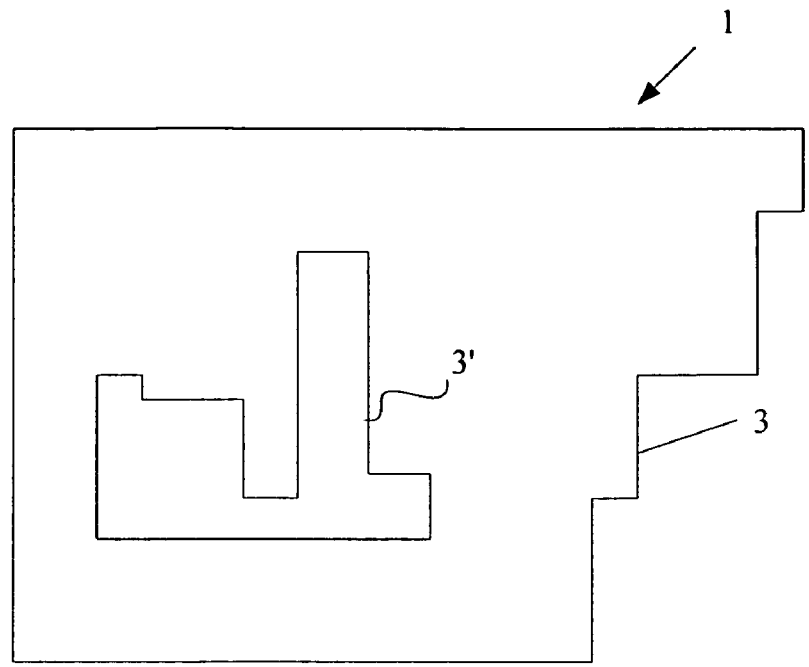
FIG. 1 shows a layout for a microelectronic circuit, for which a power grid is to be designed.

FIG. 1 shows a layout of a microelectronic circuit 1. The microelectronic circuit 1 has an outer edge 3 and, as the microelectronic circuit 1 has a recess in the center, an inner edge 3'. Therefore, an outline 3, 3' or an area of the microelectronic circuit 1 can be defined by the inner edge 3' and the outer edge 3.

Figure 2:
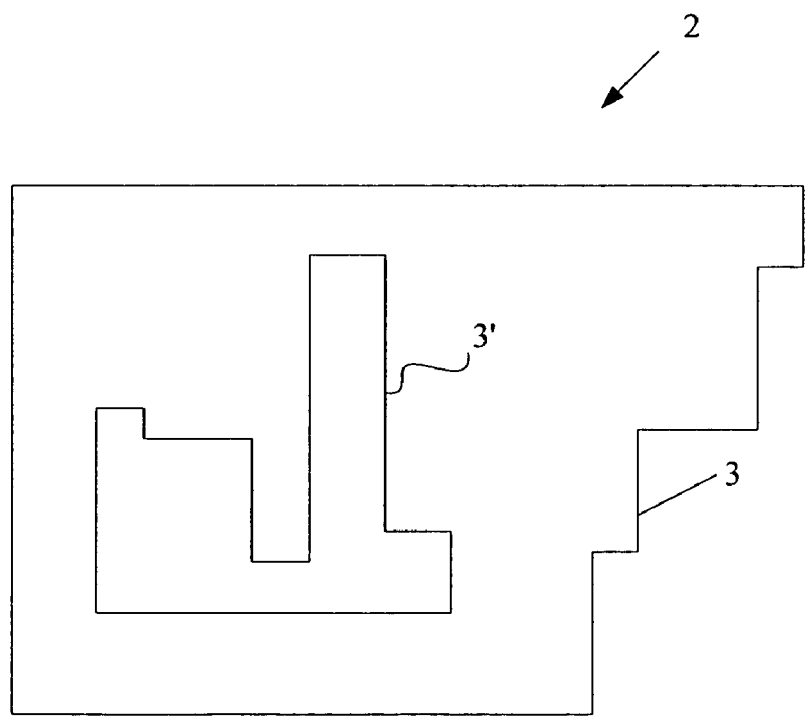
FIG. 2 shows a power grid for the microelectronic circuit shown in FIG. 1.

FIG. 2 shows a power grid 2 for the microelectronic circuit 1 which was designed with the Cadence Chip Assembly Router (CCAR) of the company Cadence in Full Custom Design Flow. The outline 3, 3' of the microelectronic circuit 1 was detected and the power grid 2 was designed with the same outline 3, 3'. In other words, the areas of the microelectronic circuit 1 and the power grid 2 are congruent, as is shown in FIGS. 1 and 2. To create the power grid 2, a pattern 4 (see FIG. 3) was defined for this purpose in a DO file, which is a command file for the CCAR, and repeated during generation of the power grid 2 until the entire previously determined area of the power grid 2 was filled up. In other words, regular information during generation of the power grid 2 is taken from the DO file and the actual geometric size of the power grid 2 is determined via the corresponding geometric size of the microelectronic circuit 1.

The DO file for the CCAR can be automatically generated with a Perl script and with an associated pattern specification file. Thus, even irregular patterns are aided, such as a direct connection of power pads for wiring at top level.

Figure 3:
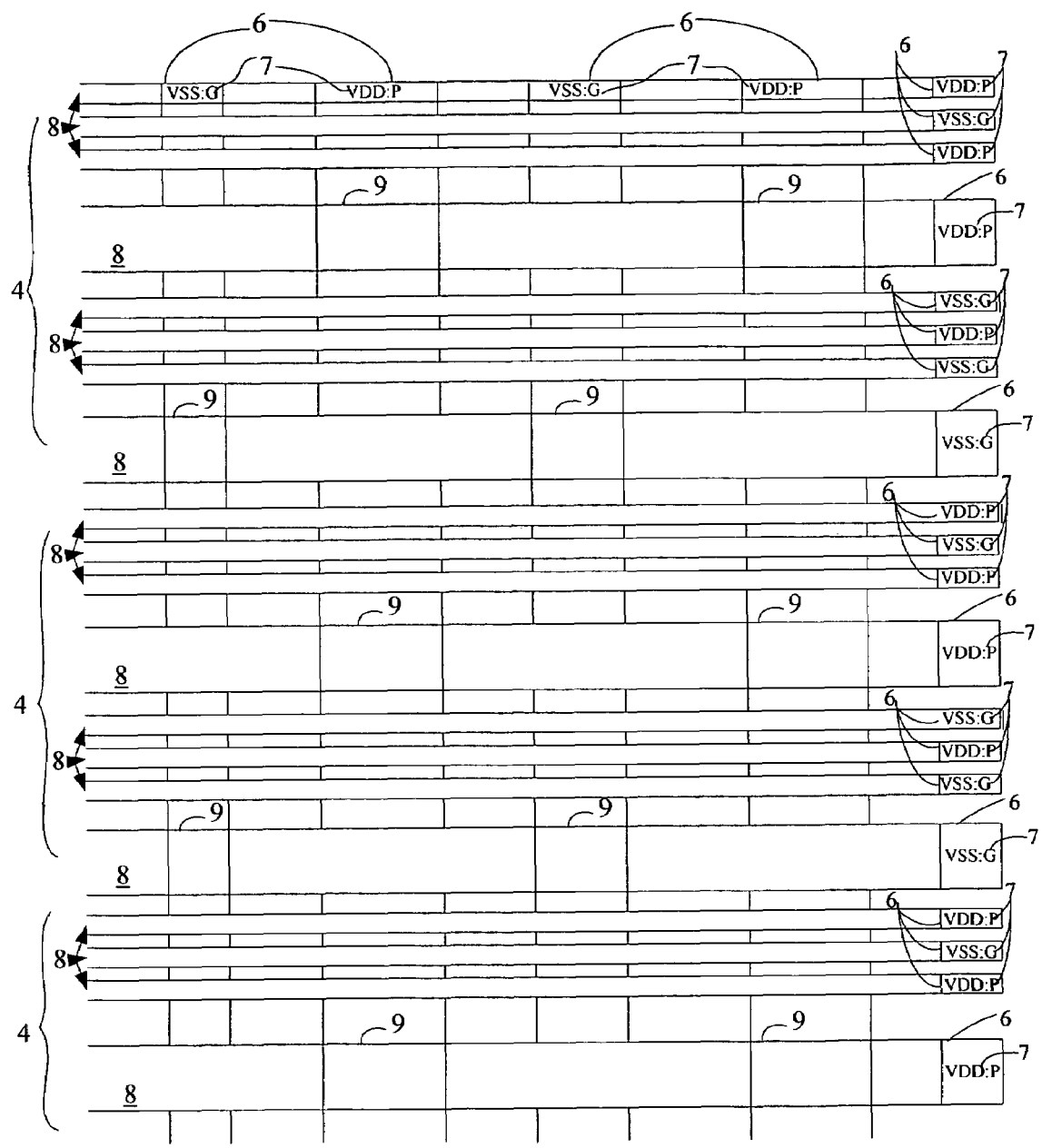
FIG. 3 shows an enlarged cutout of the power grid shown in FIG. 2.

FIG. 3 shows an enlarged cutout of the power grid 2 shown in FIG. 2. The pattern 4, which is composed of a duplicated combination of three narrower power stripes 8 and a wider power stripe 8, continues periodically over the entire area of the power grid 2. The pattern is therefore determined inter alia by the width of the various power stripes or supply lines and their spacing from one another.

In addition, pins 6 are generated for the Full Custom Design and labels 7 for the Semi Custom Design, which are evaluated by a higher-order design method and further processed. In the process, the labels 7 indicate whether a power stripe 8 identified thereby is connected to ground (VSS:G) or to a supply voltage (VDD:P).

In addition, FIG. 3 shows vias 9, which ensure a connection between different metal layers of the power grid 2. FIG. 3 shows only vias assigned to the wider power stripes. In other aspects, it is also possible to connect vias to the narrower power stripes. Furthermore vias are also applied to connect the power grid 2 and the microelectronic circuit 1.

Figure 4:
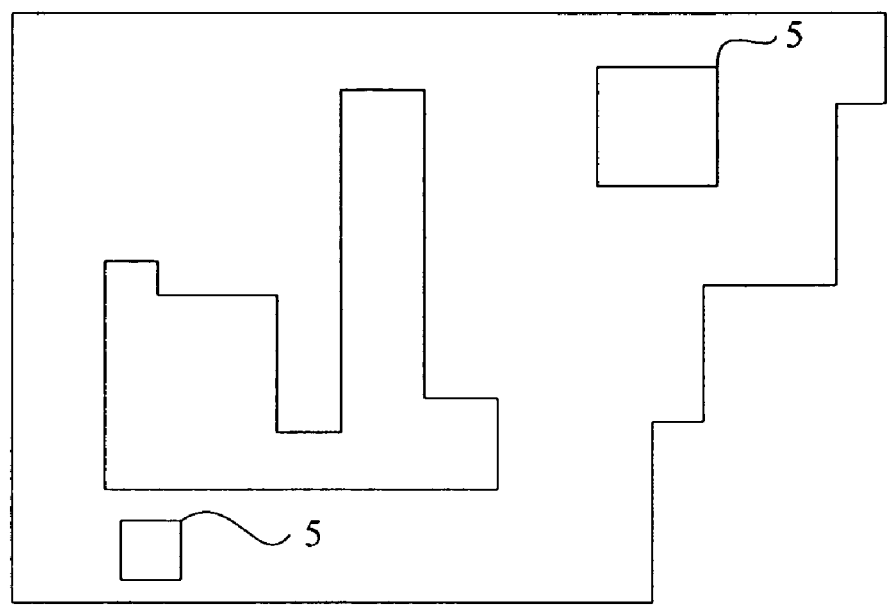
FIG. 4 shows the power grid shown in FIG. 2 with additional recesses.

FIG. 4 shows the power grid 2 shown in FIG. 2 with two recesses or exclude areas 5. The power grid 2 was designed with these two exclude areas 5, as the microelectronic circuit 1 has a very sensitive circuit section at the position of the exclude areas 5. So that these very sensitive circuit sections are not disturbed by current-carrying power stripes 8, the power grid 2 has a respective recess 5 at the corresponding positions. This means that the power grid 2 has a type of hole or gap at the exclude areas 5, so no power stripes 8 are present there.

Figure 5:
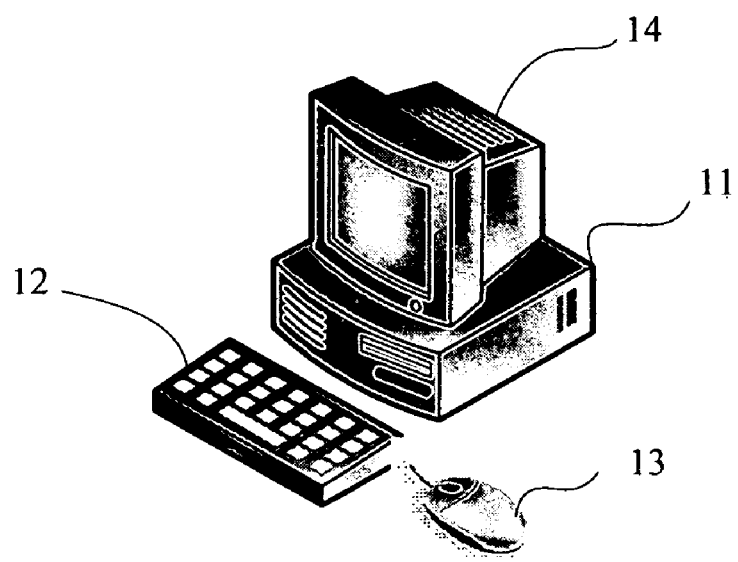
FIG. 5 shows a computer system on which the methods in accordance with the invention are implemented.

FIG. 5 shows a computer system which comprises a monitor 14, computer 11, keyboard 12 and a mouse 13. Running on this computer system is at least one computer program, by means of which the microelectronic circuit 1 is designed and which automatically creates the power grid 2 starting from the microelectronic circuit 1.

To summarize, aspects of the present invention can be used in standard tools for computer-aided design of microelectronic circuits; permit a designer to design a supply network for a microelectronic circuit more easily and quickly; after a change in the layout of a microelectronic circuit, the associated supply network can be quickly adapted, in that it is easily generated again automatically; and/or can be used both in a Full Custom Design Flow and in a Semi Custom Design Flow.

The aspects of the present invention are applicable for different levels of circuit hierarchy. The aspects are suitable to design a supply voltage network or power grid for a microelectronic circuit automatically and in a computer-aided manner. The aspects are not limited to this area of application, however, but may also be used, to automatically design in a computer-aided manner a clock carrying network or a network which supplies the microelectronic circuit with control signals for a microelectronic circuit.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for the computer-aided design of a supply network for a microelectronic circuit, the method comprising: detecting an outline of the microelectronic circuit; pre-determining a specific structure for the supply network; and designing the supply network with the outline of the microelectronic circuit and, inside the outline, with the specific structure.

2. The method according to claim 1, further comprising: pre-determining a pattern; and designing the specific structure with the pattern, which is repeated within the outline of the supply network.

3. The method according to claim 2, further comprising selecting at least one of a size and an outline of the pattern as a function of the outline of the supply network.

4. The method according to claim 1, further comprising: pre-determining at least one area; and excluding the at least one area from an area of the supply network defined by the outline.

5. The method according to claim 1, further comprising: predetermining access points of the microelectronic circuit; and designing the supply network in such a way that the access points are connected to the supply network.

6. The method according to claim 1, further comprising generating virtual connectors for further processing by a higher-order design method for the supply network.

7. The method according to claim 6, wherein the virtual connectors are at least one of pins and labels.

8. The method according to claim 1 wherein the supply network is at least one of a power grid, a clock network, and a network for distribution of control signals.

9. A device for the computer-aided design of a supply network for a microelectronic circuit, the device configured to detect an outline of the microelectronic circuit and design the supply network with the same outline, wherein the device designs the supply network within the outline with a pre-determined structure.

10. The device of claim 9, wherein the outlines of the microelectronic circuit and of the supply network are substantially congruent with each other.

11. A computer program product comprising:

a computer useable medium having computer readable code embodied in the medium, the computer readable code comprising:

computer readable code executable to detect an outline of a microelectronic circuit;

computer readable code executable to pre-determine a specific structure for the supply network; and computer readable code executable to design the supply network with the outline of the microelectronic circuit and, inside the outline, with the specific structure.

* * * * *